United States Patent [19]
Harvey et al.

[11] Patent Number: 5,589,236
[45] Date of Patent: Dec. 31, 1996

[54] COEXTRUSION OF LIQUID CRYSTAL POLYMERS AND THERMOPLASTIC POLYMERS

[75] Inventors: Andrew C. Harvey, Waltham; Richard W. Lusignea, Brighton; Leslie S. Rubin, Newton, all of Mass.

[73] Assignee: Superex Polymer Inc., Waltham, Mass.

[21] Appl. No.: 217,236

[22] Filed: Mar. 24, 1994

Related U.S. Application Data

[63] Continuation-in-part of Ser. No. 125,919, Sep. 23, 1993, abandoned, and Ser. No. 126,043, Sep. 23, 1993, abandoned, said Ser. No. 125,919, and Ser. No. 126,043, each is a division of Ser. No.778,812, filed as PCT/US90/03394, Jun. 18, 1990, Pat. No. 5,288,529, which is a continuation-in-part of Ser. No. 367,433, Jun. 16, 1989, abandoned.

[51] Int. Cl.$^6$ ............................................. C09K 19/00
[52] U.S. Cl. .................. 428/1; 252/299.01; 264/176.1; 264/177.1; 264/177.16; 425/224; 425/325; 428/480
[58] Field of Search .................. 428/1, 480; 252/299.01; 264/176.1, 177.1, 177.16; 425/224, 325

[56] References Cited

U.S. PATENT DOCUMENTS

| | | | |
|---|---|---|---|
| 4,966,807 | 10/1990 | Harvey | 428/220 |
| 5,248,530 | 9/1993 | Jester et al. | 428/1 |

FOREIGN PATENT DOCUMENTS 0503063  9/1992  European Pat. Off. .

*Primary Examiner*—Nasser Ahmad
*Attorney, Agent, or Firm*—Ostrolenk, Faber, Gerb & Soffen, LLP

[57] ABSTRACT

A flat and nearly mechanically isotropic polymer film or sheet, or a tube, can be formed by laminating two or more films, preferably by coextrusion of a liquid crystal polymer film and a thermoplastic polymer film. A liquid crystal polymer layer may be combined with one or more thermoplastic polymer layer in various arrangements. The liquid crystal, and possibly the thermoplastic as well, may have a controlled molecular orientation. The film may be formed by passing a polymer through a set of two or three tubular rotors which are concentric and have facing surfaces which define inner and outer annular polymer flow channels.

25 Claims, 9 Drawing Sheets

UNIAXIAL ORIENTATION, ALL
MOLECULES ORIENTED IN THE
MACHINE DIRECTION

BALANCED ANGLE BIAXIAL
ORIENTATION, MOLECULES
ORIENTED AT $\pm\theta$ TO THE
MACHINE DIRECTION

PLANAR ISOTROPIC
(POLYMER RODS LIE RANDOMLY
IN FILM PLANE)

**MULTILAYER BOARDS
MULTICHIP MODULES
CHIP-ON-BOARD
FLEX CIRCUITS**

COEXTRUSION OF LIQUID CRYSTAL POLYMERS AND THERMOPLASTIC POLYMERS

CROSS-REFERENCE TO RELATED APPLICATION

This is a continuation-in-part of commonly-assigned Ser. Nos. 08/125,919 and 08/126,043, both filed Sep. 23, 1993, now abandoned, which are divisionals of Ser. No. 07/778,812 filed Dec. 12, 1991, now U.S. Pat. No. 5,288,529 issued Feb. 22, 1994, which is based on PCT/US90/03394 filed Jun. 18, 1990, which is a continuation-in-part of Ser. No. 07/367,433 filed Jun. 16, 1989, abandoned.

BACKGROUND OF THE INVENTION

1. Field of the Invention

The invention relates to methods and apparatus for forming polymer film, sheet or tube comprising a mechanically isotropic liquid crystal polymer (LCP) and a thermoplastic polymer (TP). It relates more particularly to forming a film which inherently maintains its shape and has a more uniform coefficient of thermal expansion than has been obtainable previously.

The invention also relates to methods and apparatus for forming a coextruded polymer structure comprising at least one LCP layer and at least one TP layer, at least the LCP layer having a controlled molecular orientation.

2. Description of Related Art

The invention relates in general to the formation of multiaxially oriented films from high-molecular-weight liquid crystalline thermotropic or lyotropic polymers (homopolymers, copolymers, and the like), under processing conditions whereby the films have a controlled molecular orientation. These polymers generally fall into two classes, those that are modified in solution form, i.e., lyotropic liquid crystalline polymers, and those that are modified by temperature changes, i.e., thermotropic liquid crystalline polymers. For a shorthand expression covering both types of polymers, the present disclosure will use the term "liquid crystal polymers" or LCPs.

In certain embodiments disclosed herein, a liquid crystal polymer is co-extruded with a thermoplastic polymer.

The liquid crystal polymers concerned herein are believed to have a fixed molecular shape, e.g. linear, or the like, due to the nature of the monomeric repeating units comprising the polymeric chain. Linear ordered polymers are also known as "rod-like" polymers. These liquid crystal polymers can be blended with the more common, typical "coil-like" (thermoplastic) polymers in which the molecular chain does not have a relatively fixed shape. Some of these blends have processing and functional characteristics similar to liquid crystal polymers, and to that extent, these blends are to be considered as being included in the invention disclosed herein.

Preferred LCPs are of the class of aromatic copolyesters, exemplified by commercial products such as Vectra® (Hoechst-Celanese), Xydar® (Amoco Performance Products), HX type LCPs (DuPont), Eikonol® and Sumikasuper® (Sumitomo Chemical), Rodrun® (Unitika) and Granlar® (Granmont). Preferred "coil type" or thermoplastic polymers are thermoplastics such as polyethylene, polypropylene, ethylene vinyl alcohol, polyvinylidene fluoride, polyether ether ketone, polyarylate, polyamide, polyamide-imide, polycarbonate, polyethylene terephthalate, polyethylene naphthalate, polybutylene terephthalate, polyether imide, polyimide, polyphenylene sulfide, polystyrene, polyurethane, and polyvinylidene chloride. These are typical examples and do not restrict the invention.

Liquid crystal polymer films have desirable qualities in a number of applications, but significant drawbacks related to their mechanical anisotropy. They are useful in particular for forming high gas barrier films and circuit substrates. The gas barrier properties of LCPs are typically 100 to 300 times better than polyethylene terephthalate, making them useful for food and beverage packaging applications. Circuits can be formed on such a film by plating and etching, and then a plurality of such circuits can be laminated, to form a circuit board having multiple circuits accommodated within the board. Flexible circuits can also be formed on liquid crystal polymer films.

However, previously the mechanical properties of liquid crystal polymer films have been inadequate for these applications. They cannot be blown and drawn after extrusion as coil polymers can, since they become too highly oriented in the die. They are too weak in the non-orientation directions to be stretched after extrusion, even while in semi-flowable form.

To improve their strength, liquid crystal polymer films are typically extruded between a pair of concentric counter-rotating cylindrical dies to form a tube. This process causes the inner and outer surface layers of the tube to have different respective directions of orientation, and this gives the tube biaxial strength and permits blowing and drawing, if desired.

FIGS. 2A–2C are schematic representations of extruded films showing the morphology of the oriented polymer material layers therein. In FIG. 2A, with no transverse or circumferential shear, the film has a uniaxial orientation, with all molecules oriented in the machine direction, that is, longitudinally with respect to the direction of flow through the die. In FIG. 2B the film has a biaxial orientation. The molecules in the top portions of the film are oriented at an angle of +theta with respect to the machine direction while the portions of the film in the lower part of FIG. 2B are oriented at an angle of −theta to the machine direction. FIG. 2C shows a planar isotropic film wherein the polymer rods lie randomly in the film plane, not strongly oriented at any specific angle with respect to the machine direction.

A biaxially oriented tube can be slit and spread apart to form a flattened film structure. However, the present inventors have observed a problem with this process which was not previously understood. The films thus formed will not lie flat. Although such a film can be flattened by pressing under heat, it has been observed that the film regains its tendency to curl as it continues to cool after pressing. Simply described, the two surface layers of the film inherently have different coefficients of thermal expansion (CTE) axially and transversely to the orientation of their molecules. Generally, the transverse CTE is greater. So as the sheet cools, each layer will try to shrink more in its own transverse direction. But since the two layers are both part of the sheet, the sheet as a whole cannot freely shrink in either direction. As a result, stresses are stored in the layers, which makes the sheet bistable, whereby it is able to hold a curl about either of two different axes and readily adopts one of these two conditions unless an active effort is made to hold it flat.

As best understood, liquid crystal polymer films have this curling problem because they are fibrillar, i.e., they comprise relatively straight molecules. The molecules orient strongly in the die and the flowing polymer becomes anisotropic, more so than ordinary coil polymers which tend to randomize. A coil polymer tube or sheet can be strengthened biaxially throughout its entire thickness by blowing and drawing after it exits from the die. Sometimes counter-rotating dies are also used to make conventional polymers more isotropic. But the combination of shearing and stretching is much more critical and difficult to optimize with liquid crystal polymer extrudates, since they readily become highly oriented in the die anisotropically. It may not be possible to stretch the polymer substantially in the direction transverse to its fibrillar orientation.

If counter-rotating annular dies are used, to establish a biaxial or multiaxial (specifically, twisted nematic) orientation of the molecules in the flow, then transverse stretching by blowing of the extruded tube is possible and effective.

But, as mentioned above, such a process forms two layers in the film with complementary orientations, for example +/−45°, on either side of the machine direction in which the extrusion has taken place. As described above, this has led to the drawback of curling in liquid crystal polymer film sheets made from such extruded tubes. The liquid crystal polymer films become less anisotropic due to the application of transverse shear, but they still curl after cooling, because of the non-uniform CTE phenomenon mentioned above. Curl becomes very significant when the film is orthotropic, i.e., having equal properties in orthogonal directions in the plane of the film, as in a balanced biaxial film.

Another problem frequently associated with films produced by the tubular bubble process is seaming. Seams have been formed in some known methods in which film tubes are flattened or "blocked" as they are driven through pinch rolls.

These problems relate at least in part to inherent characteristics of the tubular extrusion process, and in part to the methods of system control and downstream processing, beginning with coagulation or cooling, and perhaps in part also to inadequate dope homogeneity upstream.

No techniques previously known to the art have been able to solve these problems.

U.S. Pat. No. 5,248,530 of Jester et al., issued Sep. 28, 1993 and assigned to the Hoechst-Celanese Corp., discloses coextrusion of a higher-melting LCP layer laminated with a lower-melting LCP layer. Jester et al. also discloses sandwiching the higher-melting LCP layer between two lower-melting LCP layers.

U.S. patent application Ser. No. 206,137, filed Jun. 13, 1988; Ser. No. 203,329 filed Jun. 7, 1988; and Ser. No. 098,710 filed Sept. 21, 1987; all commonly assigned herewith, disclose processes wherein biaxially oriented, substantially two-layer, liquid crystal polymer films are formed in counter-rotating annular dies by controlling the transverse shear speed, the material flow rate, the blow ratio and the draw ratio, all of which affect the molecular orientation in the final product, to obtain a substantially +/−45°orientation of the two surface layers. See also U.S. Ser. No. 209,271 filed Jun. 20, 1988.

Nagasawa et al., Japanese Disclosure No. 53-47460, discloses a manufacturing method for a lyotropic liquid crystal polymer film which includes applying transverse shearing forces to the dope. See FIG. 2 and pp. 8–9.

Other prior art of interest includes:

Urasaki, Japanese Disclosure No. 53-86798

Sugimoto et al., Japanese Disclosure No. 54-44307

Fujii et al., Japanese Disclosure No. 63-199622

Fujii et al., Japanese Disclosure No. 63-173620

Inada et al., Japanese Disclosure No. 52-109578

Miyamoto et al., Japanese Disclosure No. 54-44307

Donald, U.S. Pat. No. 3,279,501

Donald, U.S. Pat. No. 3,404,203

Sharps, Jr., U.S. Pat. 4,496,413

Isayev et al., U.S. Pat. 4,728,698

Helminiak et al., U.S. Pat. 4,377,546

The respective disclosures of all the prior art materials mentioned herein are expressly incorporated by reference.

SUMMARY OF THE INVENTION

The above-mentioned problems in the art are substantially solved by the processes and apparatus disclosed herein.

According to one aspect of the invention, bi-annular or tri-annular tubular dies may be used to coextrude liquid crystal polymer and thermoplastic polymer layers, for example to form sheets, films or tubes. The use of dies with greater numbers of annuli is also contemplated.

Another aspect of the invention is a method of forming coextruded liquid crystal and thermoplastic polymer film with nearly uniform mechanical properties, in particular a film which will lie flat and has a nearly uniform coefficient of thermal expansion in all planar directions, despite any local non-uniformity of the directional coefficients of thermal expansion in its individual layers.

Another aspect is a method of forming a coextruded liquid crystal and thermoplastic polymer film structure comprising two outer surface portions, which may be relatively thin, and a possibly relatively thick or thin inner portion. The inner portion may be oriented in at least one controllable direction and possibly partially oriented in a second controllable direction as well. The outer portions may be oriented in other controllable directions.

Preferably, at least the LCP layer has a controlled orientation. The TP layer or layers may be oriented as well.

One LCP layer may be combined, for example, with two TP layers, in any order. One of the two thermoplastic layers may serve as an adhesive or "tie layer" between the LCP and the other thermoplastic. More generally, any combination of one or more LCP layers and one or more TP layers is contemplated to be part of the invention.

According to one specific aspect of the invention, a relatively thick or thin inner portion is controlled to have an orientation which is complementary to that of the two surface portions, the respective directions of these portions preferably defining complementary angles, possibly +/−45°, with respect to the machine direction in which the extrusion is carried out.

A method of preparing this type of multiaxially oriented film from liquid crystal polymer comprises the steps of (a) subjecting axially flowing polymer material to transverse-directional motions, thereby straining the axial flow; and (b) solidifying the microscale structural orientation thus obtained. Dies for extruding this type of polymer film are described herein.

Still another aspect relates to including a central core layer, which may be an LCP layer, within a relatively thick or thin inner portion. The molecular orientation of the film structure in that central core layer may be in or close to the machine direction.

A film structure may also comprise two outer surface layers which are oriented generally in a first controllable direction; two intermediate layers respectively inward of the outer surface layers which are oriented generally in a second controllable direction; and a central core layer sandwiched between the middle layers which is oriented generally in a third controllable direction, such as in or close to the machine direction. The intermediate layers may have an orientation which is complementary to that of the adjacent outer layers. The respective directions of orientation of each outer surface layer and the adjacent intermediate layer thus may define equal and opposite angles with respect to the machine direction in which the extrusion is carried out. Or, the direction of orientation of each intermediate layer may be between that of the adjacent outer layer and that of the central core layer, thus providing a gradual change of direction from the outer layers to the central core layer. The respective directions of orientation of the outer surface layers and the intermediate layers preferably define equal and opposite angles with respect to the machine direction in which the extrusion is carried out.

Regarding the term "layer," this disclosure will describe at times a laminated film structure comprising a number of individual intermediate-product films; and at other times an integral film structure with different planar regions parallel to its main surfaces which are in some respects analogous to individual films, and having different properties in the various planar regions. The use of a term such as "layer" should be understood to refer equally to a planar region within an integral film; as well as to an individual intermediate-product film, or a portion thereof, within a laminated structure. It is to be understood that the teachings throughout this disclosure are equally applicable to both these forms of LCP or TP film.

The foregoing and other objects, features and advantages of the invention will be better understood from the following detailed description of preferred embodiments of the invention, with reference to the drawings.

DETAILED DESCRIPTION OF EMBODIMENTS OF THE INVENTION

First Embodiment

Figure 4:
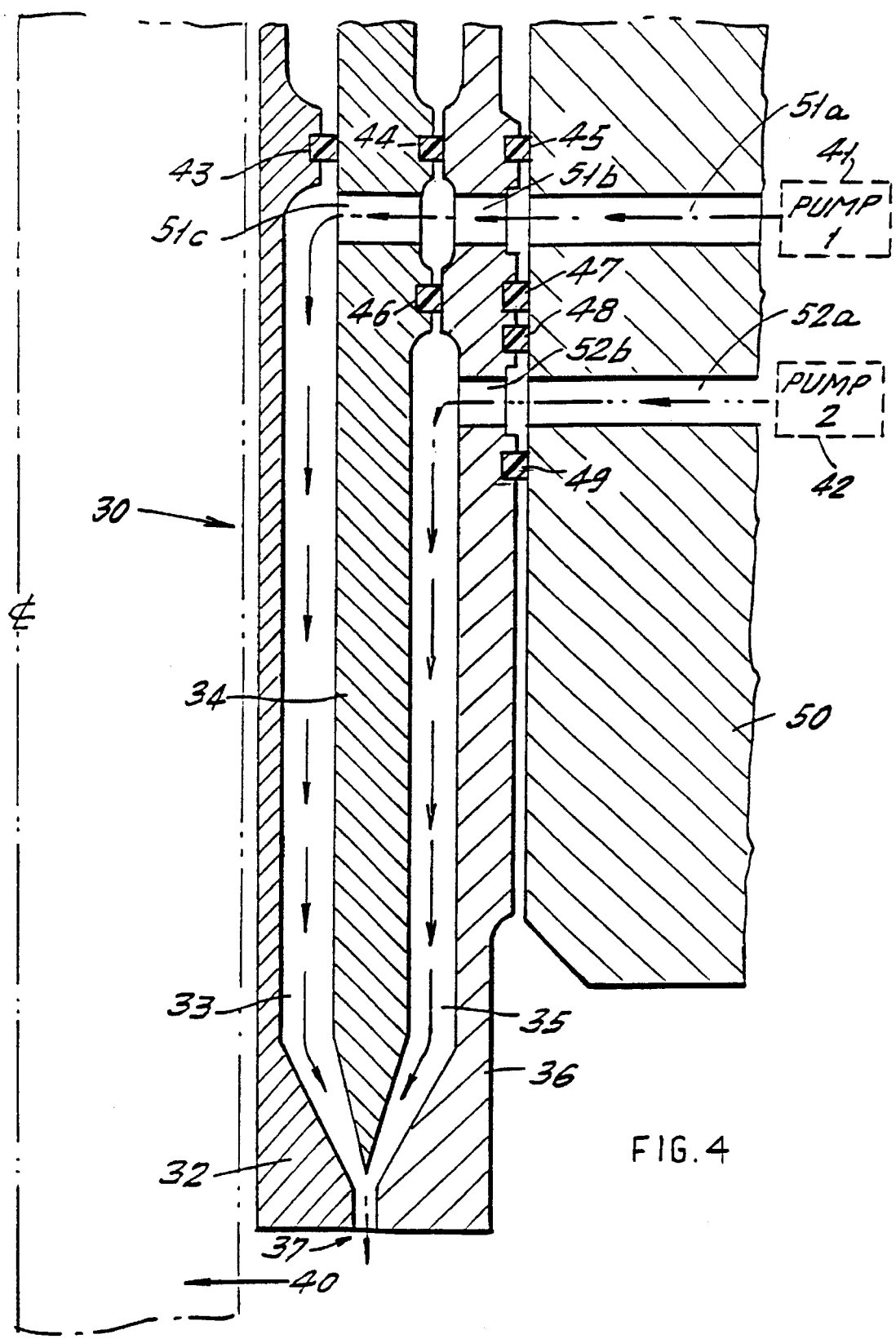
FIG. 4 is a cross-section showing a detailed example of a die assembly of the type shown in FIG. 1.

FIGS. 1 and 4–6 disclose a first method and a first apparatus for carrying out the invention. FIG. 4 is a schematic diagram, partly in cross-section, of a die that is particularly adapted to carry out the process of this invention. A liquid crystal polymer is plasticated by melting or solvating, then introduced at an inlet $51a$. The LCP passes through distribution channel $51a$ and secondary distribution channels $51b$ and $51c$. The channels $51a$, $51b$ and $51c$ and $52a$ and $52b$ comprise a plurality of individual distribution channels, for receiving a plurality of respective types of polymers, and passing them to the respective channels $51a$, $51b$, and $51c$ and $52a$ and $52b$.

A die assembly generally designated 30 comprises three tubular rotors, an inner tubular rotor 32, a middle tubular rotor 34, and an outer tubular rotor 36. A cylindrical inner space or annulus 33 is defined between the rotors 32 and 34. Similarly, an outer annulus 35 is defined between the rotors 34 and 36.

After passing through the annuli 33 and 35, the two layers of the extruded LCP and thermoplastic are joined in an exit space 37 which is defined below the rotor 34 and between the lower portions of the rotors 32 and 36.

In this example, the lowermost edge of the rotor 34 has a downward-pointed shape which corresponds to the shapes of the facing inner surfaces of the rotors 32 and 36, so that the thickness dimension of the space 37 is substantially the same as that of the annuli 33 and 35. However, this arrangement is not essential. For example, the lowermost point of cylinder 34 may be at the same level or below the level of the lowermost points of cylinders 32 and 36. Other examples of advantageous structures can be found by experimentation, and some will be discussed hereinbelow.

As a result of the joining of the respective LCP or thermoplastic flows in the space 37, a tubular film 38 is formed and extruded downwardly, and outwardly of a channel 40 through which air is conducted for blowing the film. A rotary fitting can be provided, for example, at some point along the channel 40 for introducing the blowing air.

The inner and outer rotors 32, 36 may be rotated in a first direction, for example, clockwise as seen from above in this example. The intermediate rotor 34 may be rotated in the opposite direction, namely counter-clockwise as seen from above in this example. The rotors 32, 34, 36 are connected to corresponding coaxial gears $32a$, $34a$, $36a$. The gears in turn are rotated by corresponding pinions $32b$, $34b$, $36b$. Advantageously, in this embodiment, the pinions $32b$, $36b$ may be mounted on a common axis, since they rotate in the same direction so as to rotate the rotors 32 and 36 in the same direction. Of course, by a simple mechanical modification, each of the rotors may be arranged to rotate either clockwise or counterclockwise.

Figure 1:
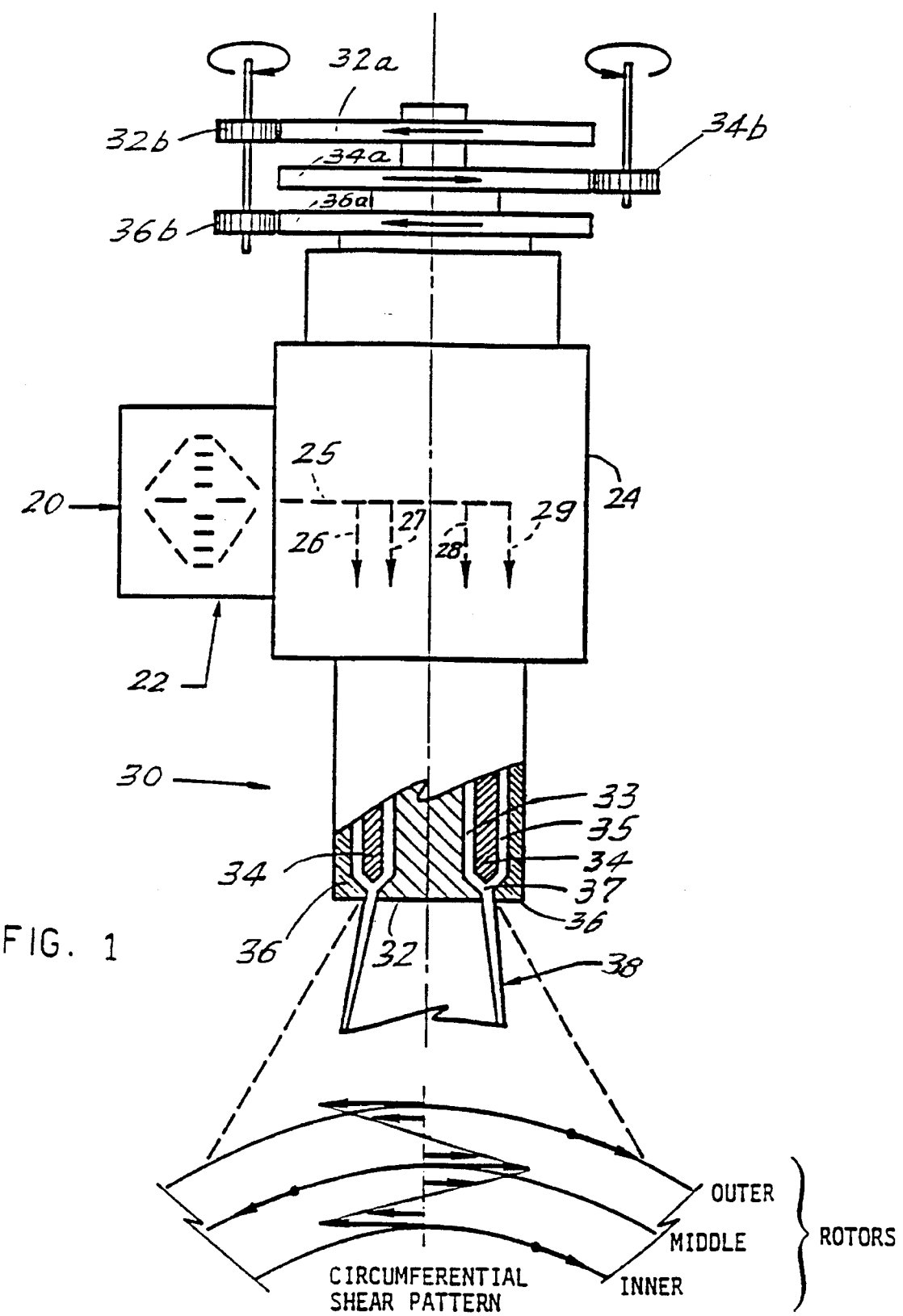
FIG. 1 is a schematic diagram, partly in cross-section, of a biaxial (two-annulus) die that is adapted to carry out a coextrusion process according to a first embodiment of the invention.

The circumferential shear pattern of the resulting film 38 is illustrated at the bottom of FIG. 1. As seen, the facing layers of the polymer flows in the annuli 33, 35 are sheared in the second direction by the rotation of the middle rotor 34, so that when joined in the space 37, these surfaces combine to form a central portion of the resulting film which thus is oriented strongly toward the second direction. Conversely, the rotation of the inner and outer rotors causes the inner surface of the flow in the annulus 33, and the outer surface of the flow in the annulus 35, to be oriented in the first direction. These two layers form the outer layers of the resulting film.

It should be understood that the circumferential shear pattern illustrated at the bottom of FIG. 1 has a combined effect with the longitudinal shear pattern in the machine direction which results from the downward movement of the polymer flows toward the exit space 37. This longitudinal shear will be the same at each interface, between the polymer flows in the annuli 33, 35, and the rotors 32, 34, 36.

Figure 3:
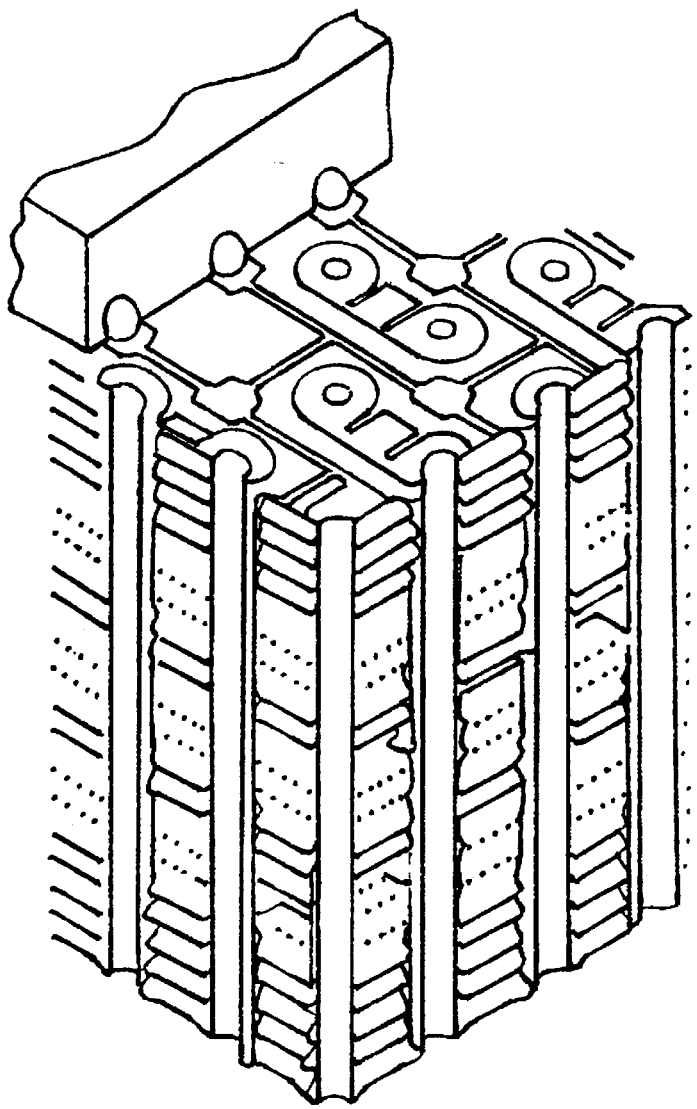
FIG. 3 shows an example of a printed circuit board comprising coextruded polymer films produced according to an example of the invention.

FIG. 3 shows an example of a printed circuit board comprising polymer films produced according to the present invention. See U.S. patent application Ser. No. 209,281 filed Jun. 20, 1988, incorporated by reference, which relates to printed circuit boards and methods for their production. Materials produced in accordance with the present invention are particularly useful for making such circuit boards.

FIG. 4 is a detailed view showing in cross-section other aspects of the die assembly 30 according to the invention. The inner rotor 32 rotates about a blowing air channel 40. LCP material is provided to the inner annulus 33 by a first pump 41. Thermoplastic polymer material is provided to the outer annulus 35 by a second pump 42. The pumps 41 and 42 may provide either the same polymer or different polymers or blends.

The inner annulus 33 is defined below a seal 43 between the inner rotor 32 and the middle rotor 34. A passage is provided from the pump 41 to the annulus 33, through the surrounding support structure illustrated schematically at 50, through a passage 51a. A further passage is defined by a pair of seals 45, 47 between the support structure 50 and the outer rotor 36, a passage 51b defined in the outer rotor 36, a pair of seals 44, 46 between the outer rotor 36 and the middle rotor 34, and a passage 51c in the middle rotor 34.

Similarly, polymer is provided by the pump 42 to the annulus 35 through, first, a passage 52a in the support structure 50, and a further passage defined by a pair of seals 48, 49 between the support structure 50 and the outer rotor 36, and a passage 52b formed in the outer rotor 36.

Conventional bleeding means can advantageously be provided from any dead space, for example the annular space between the seals 47 and 48, to the exterior.

Figure 5:
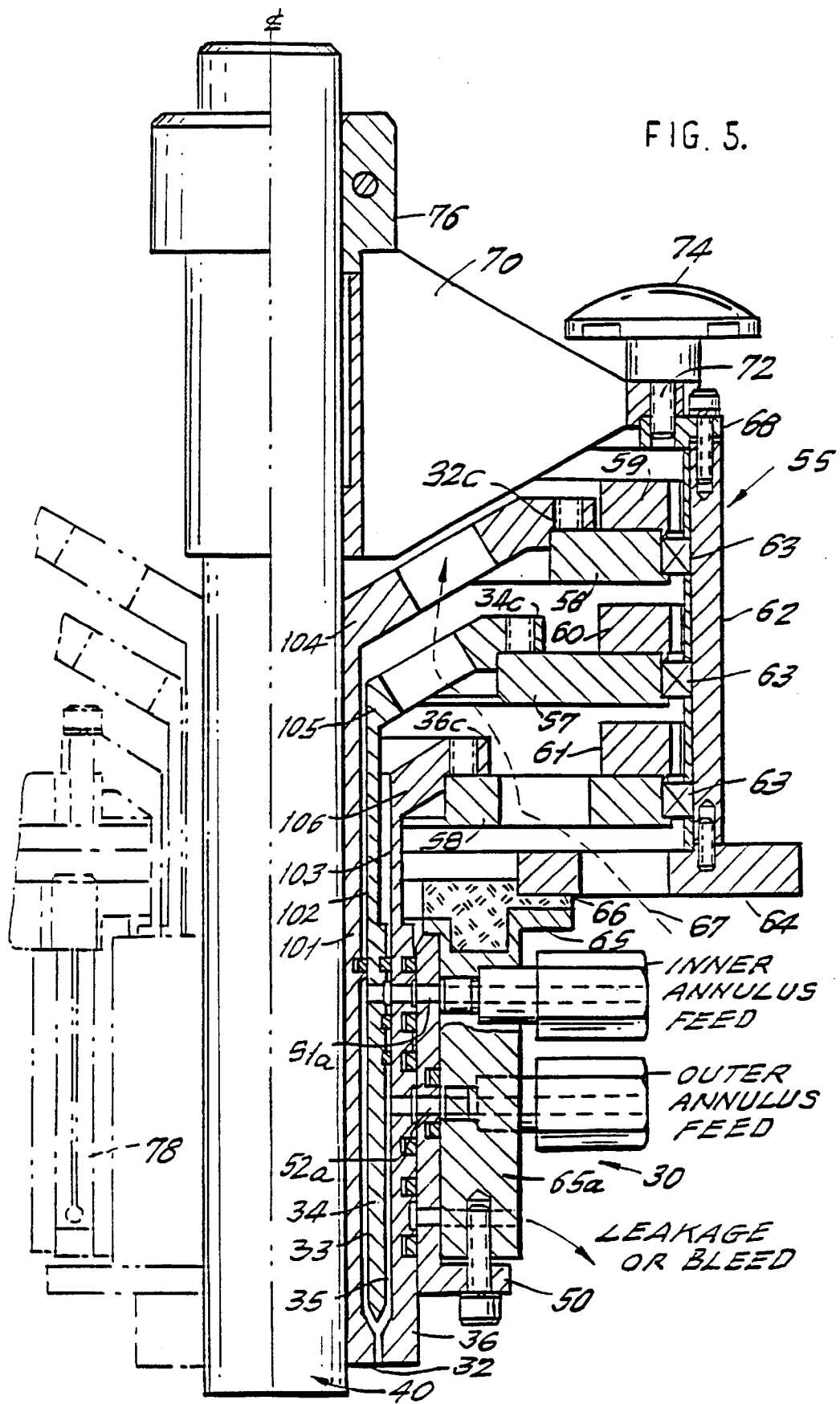
FIG. 5 is a cross-sectional view of the die assembly of FIG. 4, showing a bearing assembly.

FIG. 5 is a cross-sectional view of the die assembly 30 as well as a bearing assembly generally designated 55. As seen in FIG. 5, the rotors 32, 34, 36 are extended upward, concentric with the air channel 40, by cylindrical extension portions 101, 102, 103. The extension portions are further extended by corresponding flange portions 104, 105, 106. These flange portions have the shape of conically oriented rings extending outward from the common axis of the rotors and the channel 40, and in this embodiment, at an angle upwardly. As shown, in this example the flange portions are generally parallel to one another.

The flange portions are further extended by horizontal mounting portions 32c, 34c, 36c. These mounting portions in turn are mounted by screws or the like to respective mounting rings 56, 57, 58. In turn, respective gear wheels 59, 60, 61 are mounted on the top of radially outward portions of the mounting rings 56, 57, 58. The function of the gear wheels will be discussed further below.

Outwardly of the gear wheels and out of contact therewith, an enclosure for the bearing assembly is formed by a seamless metal cylinder 62 or the like. Ball bearings 63 or the like are mounted between the mounting rings 56, 57, 58 and the cylinder 62. A bottom cover 64, generally plate-like, is secured to and supports the bottom of the cylinder 62. The bottom cover 64, in turn, is supported by the outer, top surface of a generally cylindrical die cover 65 which surrounds the support structure 50 (see FIGS. 4 and 5) and thereby surrounds the rotors and associated structure.

An insulating ring 66 is supported on the die cover 65 and prevents thermal conduction from the die block to the bearing and drive system. As shown by the arrow 67, cooling air can pass freely through respective holes, slots or the like in the flange portions 32b, 34b, the mounting ring 58, and the bottom cover 64, for example by natural or forced convection. Secured to the top of the cylinder 62 is a top ring 68 and supported thereon is a top bearing cover 70. The top bearing cover 70 is secured to the top ring 68 by a screw 72 or the like which is operable by a hand knob 74. A bushing 76 or the like which is mounted to the top bearing cover 70 defines, at least in part, the air channel 40.

Referring again to FIG. 5, the mounting portions 32c, 34c, 36c of the rotors 32, 34, 36 are radially staggered. That is, the mounting portion 32c extends radially farther outward than the mounting portion 34c, which in turn extends radially farther outward than the mounting portion 36c. Correspondingly, the mounting ring 58 extends radially farther inward from the bearings 63 than does the mounting ring 57, which in turn extends radially farther inward than the mounting ring 56. By this structure, after removal of the cover 70, the rotors can easily be removed individually if necessary for any reason.

Further, the entire combination of the bearing assembly 55 together with the rotors 32, 34, 36 can easily be removed as a unit from the die cover 65, simply by removal of the screws that secure the die cover 65 to the bottom cover 64. Thus, repair of the die assembly and the like can be easily accomplished without disturbing the polymer supply arrangement including the channels 51a, 52a and corresponding channels associated with the die cover 65 and appropriate fittings. Also undisturbed by removal of the rotors will be the electric heater 78, also shown in FIG. 5, which again is disposed within the die cover 65, for heating the entire die assembly 30. The heater 78 is secured in the insulating ring 66 by a bushing or the like 80. An electrical conductor 81 is provided for supplying power to the heater 78.

An advantageous feature of the arrangement in FIG. 5 is that the heater 78, the polymer supply facilities and the die portions of the rotors are all disposed in the lower part of the apparatus, beneath the bottom cover 64, the insulating ring 66 and beneath the top surface of the die cover 65. Thus, all heat generating components in the case of thermotropic polymers, or solvents in the case of lyotropic polymers, are localized in the lower part of the apparatus, which prevents any adverse effect on the bearing assembly and the drive assembly.

Figure 6:
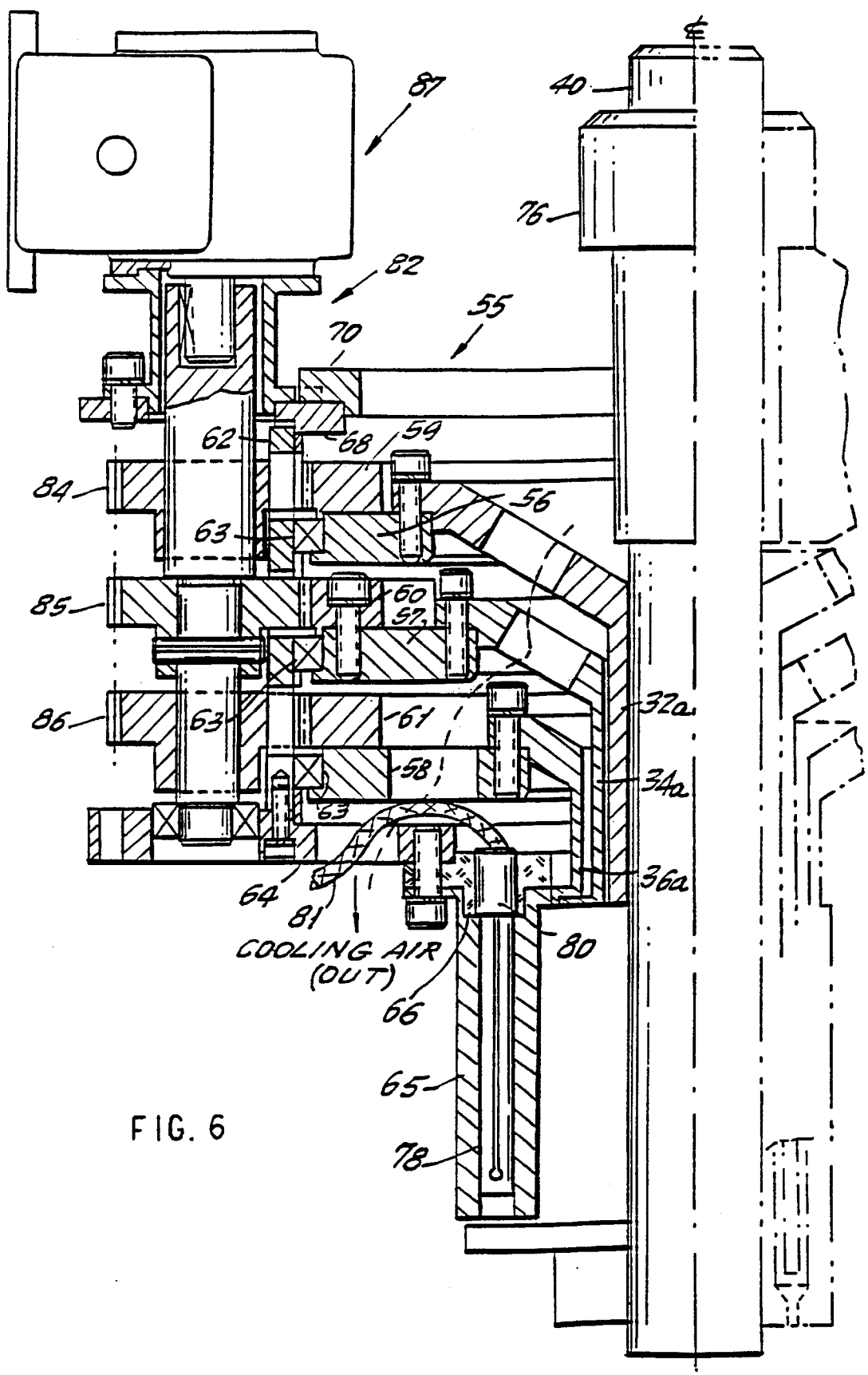
FIG. 6 is a cross-sectional view of the die assembly of FIG. 5, showing further details of the bearing assembly and also showing a drive assembly.

FIG. 6 shows further details of the bearing assembly 55 and the drive assembly 82. Slots or the like are formed in the cylinder 62 adjacent to the gear wheels 59, 60, 61. Respective pinions 84, 85, 86 are disposed outwardly of and engaging the gear wheels 59, 60, 61 so as to rotate the gear wheels and correspondingly rotate the rotors. An assembly 87 which may comprise a motor, a reduction gear, and the like is mounted above and partly supported on the top ring 68 and drives the pinion 84. Preferably two additional motors, reduction gears, and the like are provided for independently driving the pinions 85, 86. Three separate motors are expected to give the best control over the rotor speed for finely adjusting the shearing forces applied to the polymer.

Second Embodiment

According to another aspect of the invention, the advantageous type of shear pattern similar to that shown in FIG.

Figure 2A:
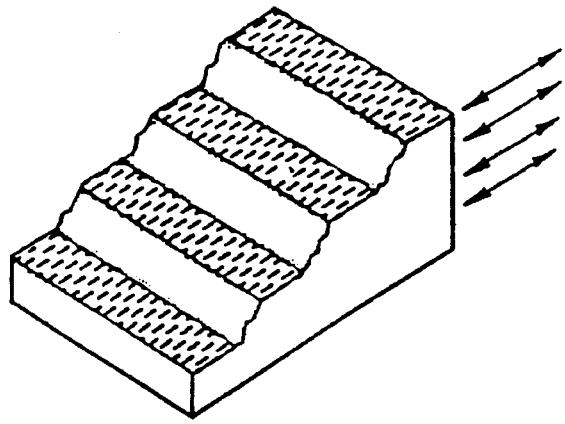
FIGS. 2A–2C are schematic representations of extruded films showing the morphology of the oriented polymer material layers therein.
Figure 2B:
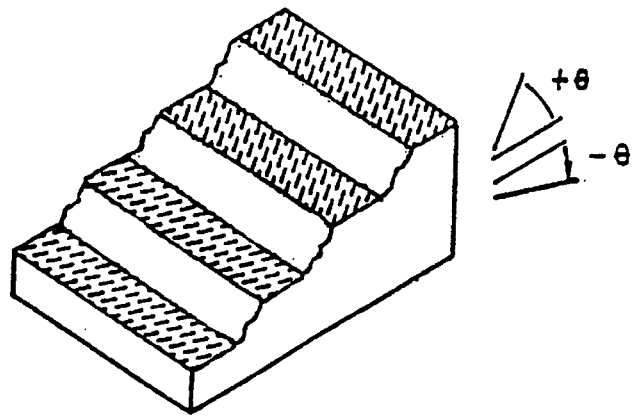
Figure 2C:
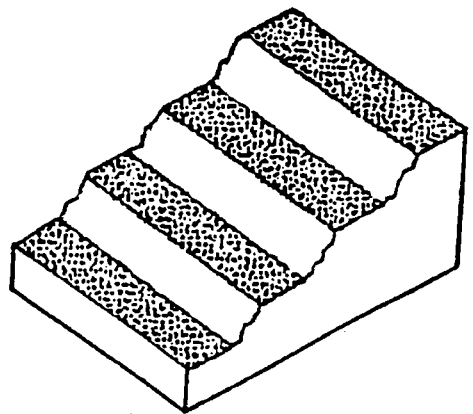

1 can be obtained by another method. A conventional extrusion die which has two counter-rotating mandrels is known to produce a balanced biaxial film of a liquid crystal or a thermoplastic polymer or a blend thereof, with a structure such as shown in FIG. 2B. We have discovered that conventional film-layering and film adhesion apparatus and methods can be used to combine two such layers and thereby obtain a combined film having the shear pattern of FIG. 2B.

Third Embodiment

Figure 7:
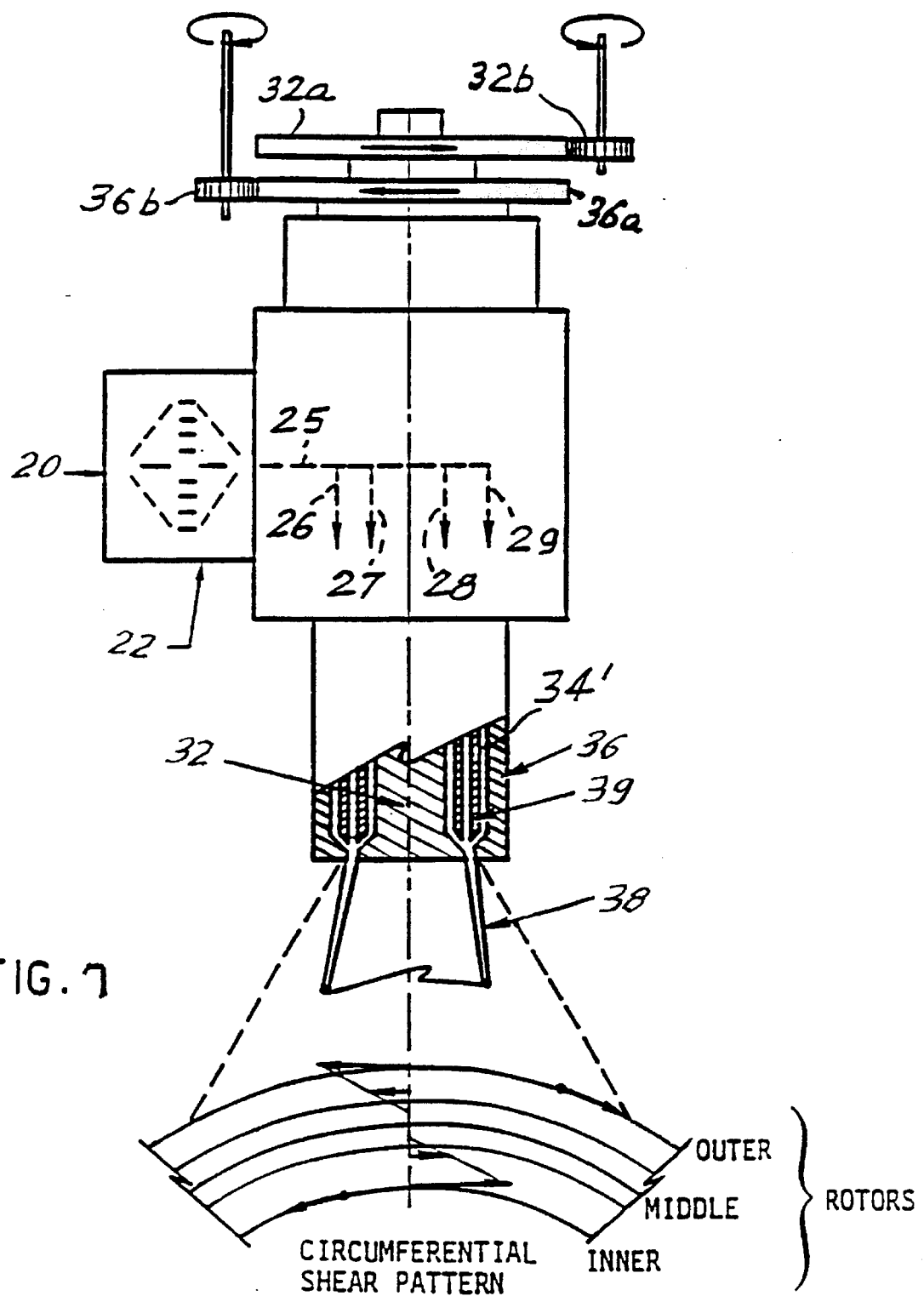
FIG. 7 shows a tri-axial (three-annulus) die which is a modification of the embodiments shown in FIGS. 1 and 4–6, for illustrating a second embodiment of the invention.
Figure 8:
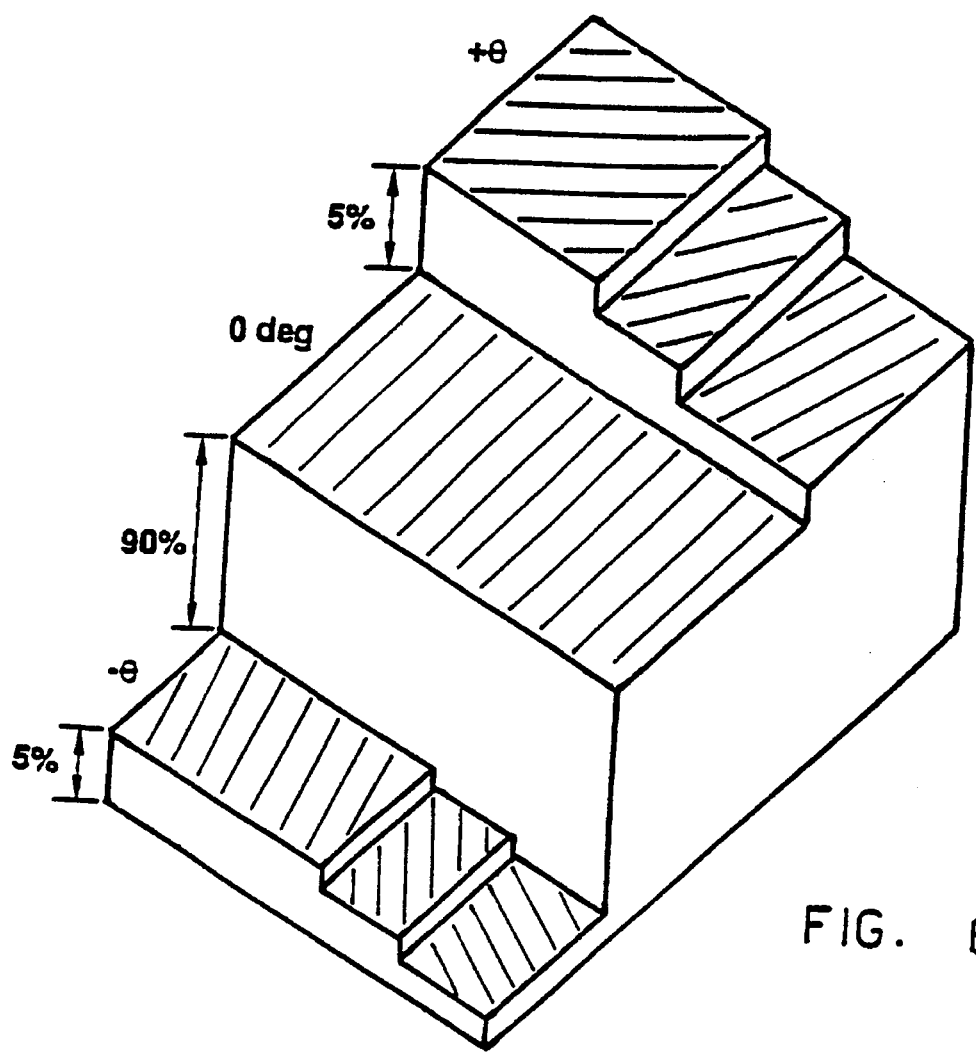
FIG. 8 shows the molecular orientation of a film produced by the die of FIG. 7.

FIGS. 7–8 illustrate another method and apparatus embodying the invention. FIG. 7 shows a tri-axial (three-annulus) die which is a modification of the embodiments shown in FIGS. 1 and 4–6. Only the portions of this embodiment which differ from those in the first embodiment will be discussed, to eliminate redundant explanation.

In this embodiment, the inner rotor 32 and the outer rotor 36 are driven by the corresponding gearing 32a, 32b, 36a, 36b in opposite directions. A non-rotating member 34' is disposed between the inner and the outer rotors in a position corresponding to that of the middle rotor 34 in FIG. 1. A coaxial annular passage is formed through the non-rotating member 34'. The orientation of the film produced by this die is shown at the bottom of FIG. 7 and also in FIG. 8. A substantial central core layer of the film, which may constitute about 90% of its thickness, is oriented in the machine direction. The polymer material supplied to the inner annulus 33 and outer annulus 35, which may be the same or different polymers, acted on respectively by the counter-rotating inner rotor 32 and outer rotor 36, create relatively thinner surface layers which each may constitute approximately 5% of the thickness of the film. The thickness of the surface layers can be adjusted as desired by adjusting the polymer flow rates. These surface layers are oriented in complementary directions with respect to the machine direction. At the surface of the film, the orientation advantageously is plus/minus 45°. The angle of orientation is reduced gradually between the surface and the central core layer, whereby the direction of orientation gradually becomes the machine direction.

It should be recognized that the flow streams in the three coaxial annular passages do not have to consist of the same polymer or polymer blend. For example, an LCP could flow in the annulus 39 while a blended polymer (LCP plus TP) or a thermoplastic polymer could flow in the outer and inner annuli 33 and 35. Co-extrusion has not typically been practiced with apparatus of this type. Specific examples of coextrusion will be discussed below.

The extrudate formed according to FIGS. 7 and 8 can be slit to form a film or sheet or can be left in tubular form. The substantial, nearly uniaxial central core layer gives the resulting film or tube greater tensile and compressive strength (Young's modulus) in the machine direction than products produced with conventional methods and apparatus. The strength of the tubing or film is increased depending on the amount of material passing through the non-rotating annulus 39. For example, if less strength but more flexibility is needed, less material could be supplied through the non-rotating annulus 39. This embodiment produces an extremely strong tube or film which has some of the advantages of a balanced biaxial film and also enhanced strength due to the uniaxial central core layer.

Fourth Embodiment

Figure 10:
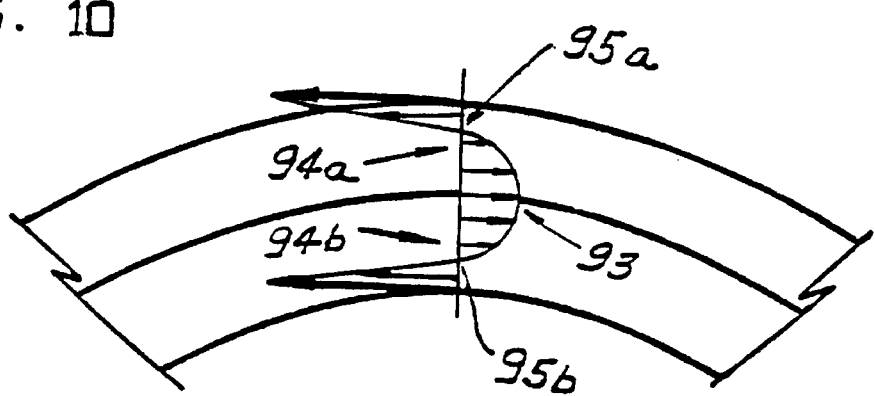
FIG. 10 shows the shear pattern of a polymer flow through the device of FIG. 9.
Figure 9:
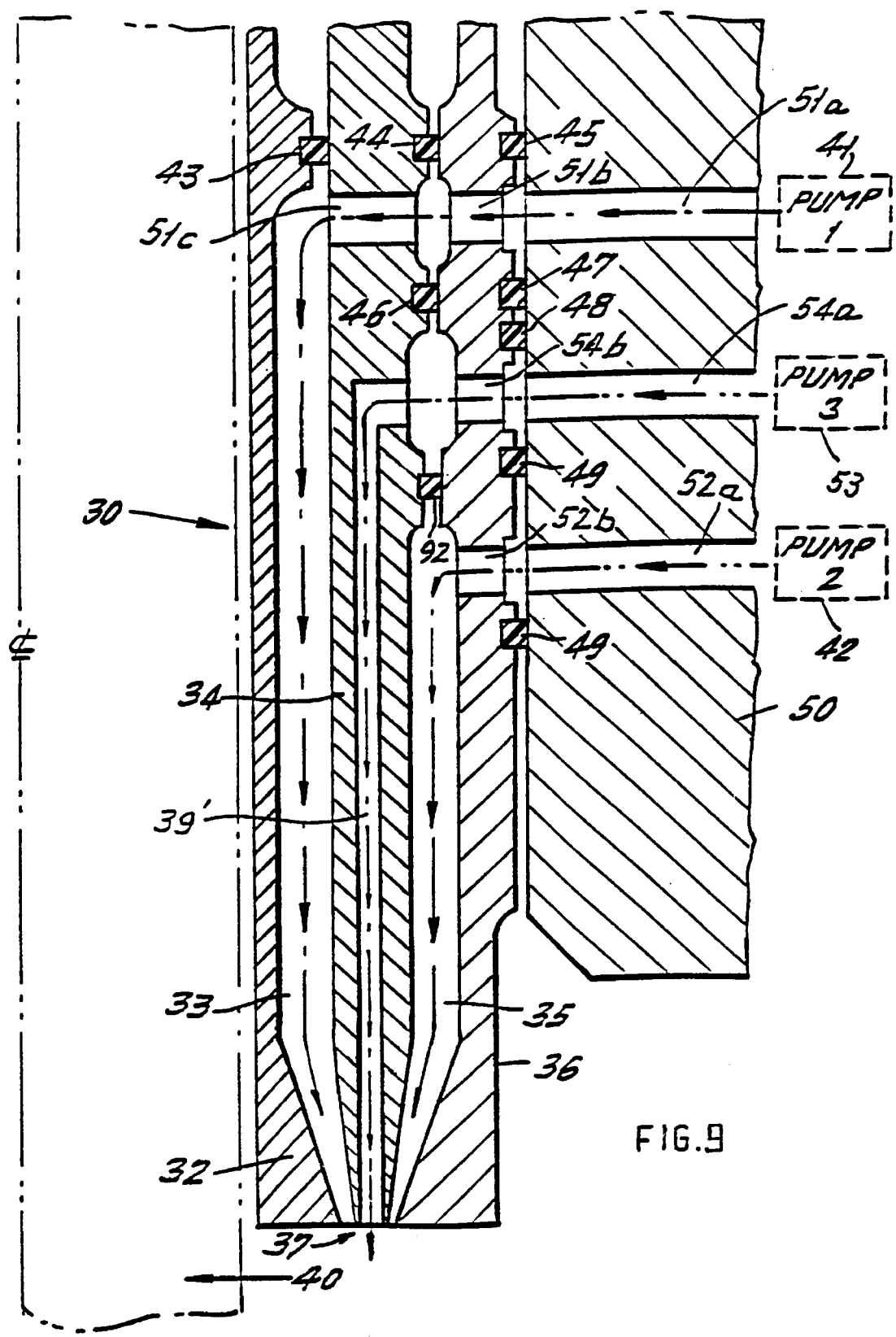
FIG. 9 is a cross-section showing a detailed example of a triaxial die assembly according to a third embodiment of the invention.

According to another form of the invention, shown in FIGS. 9 and 10, the embodiment of FIGS. 1 and 4–6 has been modified by providing a middle annulus 39' formed within the middle rotor 34". Material is supplied from a pump 3 designated 53 through a passage 54a, 54b, this passage in turn being sealed by an additional seal 92.

In the apparatus of FIG. 9, preferably, the middle rotor 34" is rotated slowly, to minimize the spiraling orientation of the central core layer which results from the rotation of the middle rotor 34". The outer and inner rotors 32, 36 preferably rotate together, at the same rotational speed, but in the opposite direction, creating a shear pattern as shown in FIG. 10. The outer and inner rotors preferably rotate at a higher rotational speed than the middle rotor.

In FIG. 10, the central core layer 93 is sheared slightly by the motion of the middle rotor and thus is oriented at a small angle which will be defined as a negative angle with respect to the machine direction. The respective outer layers 95a, 95b are preferably oriented at a positive angle of at least 5° to the machine direction. The angle of orientation of the surface layers should be made as large as possible. A gradual transition between the positive angle of the surface layers 95a, 95b and the core layer 93 occurs in the intermediate layers 94a, 94b.

Coextrusion of different liquid crystal polymers, thermoplastic polymers and blended polymers is possible in this embodiment as it was in the previous embodiment. One of the thermoplastic polymers may act as an adhesive or "tie layer" between the LCP layer and the other TP layer. In the past, coextrusion has not typically been practiced with apparatus as shown in FIG. 9.

Coextrusion of LCPs and TPs

As mentioned above, in connection with the first through fourth embodiments, multilayered coextrusions can be produced using LCP's in combination with thermoplastic polymers and blended polymers, using the methodology and apparatus described in connection with FIGS. 1–10.

Coextrusion of polymers is known per se. Thermotropic liquid crystal polymers (LCP's) and thermoplastics may be simultaneously extruded (coextruded) through an apparatus such as a feedblock coextrusion die or flat manifold coextrusion (see, for example, Osborn, K. R. and Jenkins, W. A., *Plastic Films*, Technomic, 1992, pages 118 to 129). Many types of polymers are coextruded using dies in which two or more melt streams converge and remain in distinct multilayers due to uniform laminar flow. Such dies can be flat, producing a flat film or sheet, or circular, producing a tubular film or cylinder.

When LCP's are used with conventional coextrusion dies, the long, rigid LCP molecules tend to align in the primary flow direction (the machine direction), which produces a uniaxially oriented LCP layer. This is undesirable since the LCP layer will be very weak transverse to the machine direction, and will split easily down the length of the film, sheet or tube. This anisotropy is a common property of LCP's extruded with conventional methods, and has been overcome by using transverse shear to provide biaxial orientation within an extrusion die prior to extrusion from the die (see U.S. Pat. Nos. 4,939,235; 4,966,807; and 4,975,312, incorporated by reference herein).

It is desirable, accordingly, to make an improved coextruded LCP and thermoplastic film, sheet or tube wherein the LCP layer or layers are biaxially oriented and exist in a layer or multiple layers with thermoplastic polymers or LCP-thermoplastic blends.

Fifth Embodiment

The product of this embodiment is a multilayer film, sheet or tube with LCP on one side and thermoplastic on the other side, where the LCP layer is biaxially oriented and from 5% to 95% of the total thickness. Coextruded films are approximately 0.0002 to 0.010 in. thick, sheets are 0.010 to 0.100 in. thick, and tubes have a wall thickness of 0.0005 to 0.100 in.

The apparatus of FIG. 1 is used with two types of polymers, one a thermotropic LCP, such as Vectra®, Xydar®, or other polymer capable of forming an anisotropic melt; and another one, a thermoplastic polymer, such as polyethylene terephthalate, polybutylene terephthalate, polynaphthalene terephthalate, polyamide, polyimide, polyarelene ether ketone, polyphenylene sulphide, polycarbonate, polystyrene, or polyolefin. The LCP is pumped, for example, by the first pump 41, as shown in FIG. 4, and the thermoplastic is pumped by the second pump 42. It is recognized that the LCP could alternatively be pumped by the second pump and the thermoplastic by the first pump. When the two streams meet in region 37, they form distinct layers such that each polymer is continuous around the tubular extrudate. The relative thickness of each layer is controlled by the flow from the pumps and the size of the annular channel regions designated as 33 and 35. When the LCP flow from pump 1 is half that of the thermoplastic from pump 2, the thickness of the LCP will be approximately one-half that of the thermoplastic. In order to keep the pressure in the LCP in the annulus 33 approximately equal to that of the thermoplastic in the annulus 35, the width of annulus 33 should be about half that of annulus 35 when the flow from pump 1 is half that of pump 2. Various thickness layers can be made in this way, so that the LCP layer can be from about 5% to 95% of the total film thickness, the total film thickness being from about 0.0002 in. to 0.010 in. Coextruded sheets can be made using the same method, but with a larger die gap to produce a thickness of 0.010 to 0.100 in. Tubes, pipes and cylinders can also be coextruded in this way, with wall thickness from about 0.0005 to 0.100 in.

In order to produce biaxial orientation in the LCP layer, the die components 32 and 34 are rotated in opposite directions from one another when the LCP is present in annulus 33. When the LCP is present in annulus 35, then die components 36 and 34 are rotated in opposite directions from one another. The counter-rotation of these die components, which are the boundary surfaces of the LCP stream, produces the required transverse orientation in the LCP melt due to shearing forces which orient the LCP molecules. When the biaxially oriented LCP stream meets the thermoplastic stream in region 37, biaxial orientation is retained in the LCP layer by virtue of the relatively long relaxation time of the LCP.

The thermoplastic layer may also be biaxially oriented by the rotating action of the die, and the degree of orientation retained by the thermoplastic will depend upon its relaxation time.

Coextrusion with this invention can be done with polymers having similar or dissimilar melt temperatures. When coextruding LCP and thermoplastic layers, and the melt temperatures are approximately the same, or within about 30° C. of one another, then all die components will be at approximately the same temperature. If they are not within about 50° C. of one another, then the die components 32 and 36 should contain separate heaters to control the temperature of the layers, and the pumps 41, 42 and the polymer delivery tubing 51a, 52a, will be maintained at different temperatures, corresponding to the different melt temperatures of the polymers. When the two streams meet at region 37, they will come to approximately the same temperature in a brief period of time, and then cool after exiting the die. During the cooling process, after exiting the die, the coextruded film can be biaxially stretched by internal pressure and longitudinal stretching on the tubular extrudate.

As an example, a thermotropic LCP such as Vectra® type A-950 (Hoechst-Celanese Corporation) can be coextruded with PET type 13339 (Eastman Chemical), with both polymers maintained at a temperature of about 280° to 300° C. The die components are rotated in opposite directions as explained above, producing a shear rate in the LCP melt stream of about 10 to 1000 $sec^{-1}$. The tubular extrudate is drawn in two orthogonal directions after extrusion, with a biaxial draw ratio of between 1.5 to 1 and 40 to 1.

Sixth Embodiment

The product of this second embodiment is a multilayer film wherein there are three layers: a biaxially oriented LCP layer on one side comprising 10% to 90% of the total thickness, a first thermoplastic layer on the LCP layer comprising at least 5% of the total thickness, and a second thermoplastic layer on either the LCP layer or the first thermoplastic layer, comprising at least 5% of the total thickness.

The apparatus of FIG. 7 may for example be used with two or three polymers, pumped from pumps 1, 2, and 3 in FIG. 11, in the following ways:

a)

pump 1: thermoplastic A pump 2: LCP pump 3: thermoplastic B b)

pump 1: LCP pump 2: thermoplastic A pump 3: thermoplastic B

The LCP may be the same material as in the first coextrusion embodiment. It is recognized that thermoplastic A or B could be a polymer such as polyethylene terephthalate, polybutylene terephthalate, polynapthalene terephthalate or other polyester, polyamide, polyimide, polyarylene ether ketone, polyphenylene sulphide, polycarbonate, polystyrene, or polyolefin. It is also recognized that thermoplastic A or B could be a blend of LCP and one or more of thermoplastic polymers. It should be further recognized that pumps 1, 2, and 3 could be used in any order with thermoplastic A or B or the LCP.

In order to produce biaxial orientation in the LCP layer, the die components 32, 34" and 36 in FIG. 9 are rotated to produce transverse shear in the LCP melt stream, as explained in a similar way in the first coextrusion embodiment. In the case of example (b), above, for example, transverse shear is produced in the LCP layer by rotating the inner rotor 32, and the center rotor 34", in opposite directions to one another. Transverse shear is applied to the LCP melt in the annulus 33, supplied by pump 1, by virtue of the boundary surfaces moving in opposite directions. It is recognized that alternatively the LCP could be supplied by pump 2 and the die components 34" and 36 could be rotated in opposite directions from one another.

It should further be recognized that the non-rotating annulus 39 in the die component 34' shown in FIG. 7 could be rotated by the same type of drive mechanism shown in FIG. 1, with gear 34a and pinion 34b, such that the center component 39 would rotate at a controllable speed.

In a preferred embodiment of example (a), above, the thermoplastic A is PET, such as 13339 (Eastman Chemical)

and the LCP is Vectra®A-950 (Hoechst-Celanese). The flows from pumps 1, 2, and 3 are about equal, and each of the layers of thermoplastic A and the LCP layer are about equal. The total film thickness is about 0.0005 to 0.010 in.

Alternatively, the flow of LCP from pump 3 can be slowed to about one-half to one-tenth of the flow in pumps 1 and 2, which will cause the LCP layer thickness to be about one-half to one-tenth that of the thermoplastic layer. In the case of thinner LCP layers, the annulus 39' should be proportionately smaller than the annuli 33 and 35 to maintain approximately equal pressure when the flows meet at region 37. The temperature of the die parts should be approximately 270° to 300° C., and the inner rotor 32, and center rotor 34", turn in opposite directions to produce a shear rate of approximately 10 to 1000 $sec^{-1}$ in the LCP stream in the annulus 35, to provide biaxial orientation. When the LCP is delivered by pump 1, then inner rotor 32 and center rotor 34" are rotated. When the LCP is delivered by pump 2, then outer rotor 36 and center rotor 34" are rotated. The tubular extrudate is drawn in two orthogonal directions after extrusion, with a biaxial draw ratio of between 1.5 to 1 and 40 to 1.

It is recognized that the orientation in the LCP layer is controlled by the pump flow, the dimensions of the die, the die rotation rate, the blow-up ratio on the extrudate, and the longitudinal draw ratio on the extrudate.

Seventh Embodiment

The product of this embodiment is a multilayer film with a biaxially oriented LCP layer in the center of the film, comprising 10% to 90% of the film thickness, and a thermoplastic layer on either side of the LCP layer, wherein each thermoplastic layer is at least 5% of the total film thickness, and the thermoplastic layers are of the same or different thermoplastic materials. The LCP and thermoplastic polymers may be the same as in the first coextrusion embodiment.

The apparatus of FIG. 7 is used, wherein the center rotor 34 is stationary. The center rotor is recessed, to form an exit space as shown in FIG. 7, at the exit of the die formed by the outer rotor 36 and inner rotor 32. The center component 34' contains an annulus 39 which is fed with LCP by a polymer pump, corresponding to the pump 53 shown in FIG. 9, referred to therein as pump 3. The annuli 33 and 35 are fed by pumps 1 and 2 corresponding to those in FIG. 9.

Thermoplastic A is fed by pump 1, and thermoplastic B is fed by pump 2. It is recognized that thermoplastics A and B may be the same, and may be thermoplastic polymers such as those mentioned in the first and second coextrusion embodiments. The LCP is fed by pump 3, delivered to the annulus 39 within the center component 34'. The LCP exits the center component 34', coming into contact with the thermoplastic in annuli 33 and 35 prior to exiting the die gap (exit space 37) formed by inner rotor 32 and outer rotor 36. The duration of this contact can be controlled by the flow rate from the pumps and by the lengths of the rotors, and should preferably be from 0.1 to 10 sec.

The inner and outer rotors are rotated in opposite directions to one another, and the center component 34' is stationary. In the contact region 37 between the end of the center component and the exit of the die, transverse shear will be applied to the LCP layer through the differential rotation of thermoplastic in annuli 33 and 35. This transverse shear will produce biaxial orientation in the LCP layer. The degree of transverse orientation will depend upon: the rotation rate of the rotors, the flow of polymer from the pumps, the viscosity of the thermoplastic(s), and the distance the center rotor is recessed from the die exit. Preferably, the rotation rate will be such to produce a shear rate of 10 to 1000 $sec^{-1}$ in the thermoplastic and LCP layers.

In a preferred embodiment, the LCP is Vectra® A-950 (Hoechst-Celanese) and thermoplastic A and B are the same polymer, namely PET 13339 (Eastman Chemical). The die temperature is 270° to 300° C. The tubular extrudate is stretched biaxially after extrusion such that the biaxial draw ratio is between 1.5 to 1 and 40 to 1.

Although the invention has been described herein with respect to specific embodiments and aspects thereof, the appended claims are not limited to the disclosure. For example, any combination of LCP's and thermoplastic polymers, or blends thereof, can be used with any of the apparatus herein. The invention is to be construed as embodying all modifications and variations that may occur to one of ordinary skill in the art which fairly fall within the teachings herein.

What is claimed is:

1. A multilayer film prepared from one or more liquid crystal polymers (LCPs) and one or more thermoplastic polymers (TPs) having at least one LCP layer which has a controlled molecular orientation.

2. A multilayer film as in claim 1, wherein LCP and TP layers are arranged with outer layers covering at least one inner layer, and an LCP layer is an inner layer and at least one TP layer is an outer layer.

3. A multilayer film as in claim 2, wherein said outer TP layer is an adhesive layer.

4. A multilayer film as in claim 1, wherein the LCP and TP layers are arranged with outer layers covering at least one inner layer, and at least one LCP layer is an outer layer and a TP layer is an inner layer.

5. A multilayer film as in claim 1, wherein one said TP layer is arranged between two selected layers and adheres said two selected layers to each other.

6. A multilayer film as in claim 5, wherein said two selected layers are an LCP layer and a TP layer.

7. A multilayer film as in claim 5, wherein said two selected layers are two LCP layers.

8. A multilayer film prepared from a liquid crystalline polymer (LCP) layer and a thermoplastic polymer (TP) layer, having two main surfaces and said LCP layer having a controlled molecular orientation, which is defined by selected angles with respect to a longitudinal axis of said film, said LCP layer having a surface region wherein said angles defined by said molecular orientation generally have values defined as positive, and an inner region wherein said angles generally have negative values, wherein said layers are constituted by forming said LCP layer and said TP layer in a continuous process.

9. A multilayer film as in claim 8, wherein said LCP layer is a biaxial film formed by employing a two-rotor counter-rotation die whose rotors have opposite directions of rotation, and wherein the molecular orientation angles of the facing laminated surfaces are substantially balanced.

10. A multilayer film as in claim 8, wherein said inner region is a portion of an integral film structure formed by a single die-forming process.

11. A multilayer film as in claim 10, wherein said integral film structure is formed by employing a tubular die having three concentric rotors which form two annular flow channels therebetween; supplying the respective polymers through said channels; rotating at least the outer rotor which is in contact with said LCP in a first direction while rotating the middle rotor in the opposite direction; and joining the respective polymer films formed in said channels to form said integral film structure.

12. A multilayer film as in claim 8, wherein the one of said outer rotors which is not in contact with said LCP is also rotated, so that said TP layer also has a controlled molecular rotation.

13. A multilayer film as in claim 8, wherein said LCP layer constitutes 5–95% of the thickness of said film.

14. A multilayer film as in claim 8, wherein said film is about 0.0002–0.010 in. thick.

15. A multilayer film as in claim 8, wherein said film is formed into a sheet about 0.010–0.100 in. thick.

16. A multilayer film as in claim 8, wherein said film is formed into a tubular shape.

17. A multilayer film as in claim 8, wherein said molecular orientation on one side of the midplane of the film is substantially a mirror-image of the orientation on the other side of the midplane.

18. A multilayer film as in claim 8, wherein said liquid crystal polymer is thermotropic.

19. A multilayer film as in claim 18, wherein said polymer is an aromatic copolymer.

20. A multilayer film as in claim 19, wherein said thermoplastic polymer is PET.

21. A multilayer film as in claim 1, wherein said at least one LCP layer with a controlled molecular orientation is adhered to a second layer prepared from a polymer selected from the group consisting of thermoplastic polymers and liquid crystal/thermoplastic polymer blends.

22. A multilayer film as in claim 21, wherein said second layer is prepared from a liquid crystal/thermoplastic polymer blend.

23. A multilayer film as in claim 8, wherein said TP layer is prepared from a liquid crystal/thermoplastic polymer blend.

24. A multilayer film as in claim 1, said film being tubular in shape.

25. A multilayer film as in claim 16, wherein said film is about 0.0005–0.100 in. thick.

* * * * *